United States Patent
Toshimori et al.

(10) Patent No.: US 10,060,025 B2
(45) Date of Patent: Aug. 28, 2018

(54) AG ALLOY SPUTTERING TARGET, METHOD OF MANUFACTURING AG ALLOY SPUTTERING TARGET, AG ALLOY FILM, AND METHOD OF FORMING AG ALLOY FILM

(71) Applicant: MITSUBISHI MATERIALS CORPORATION, Tokyo (JP)

(72) Inventors: Yuto Toshimori, Sanda (JP); Sohei Nonaka, Sanda (JP); Hideharu Matsuzaki, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/502,019

(22) PCT Filed: Sep. 15, 2015

(86) PCT No.: PCT/JP2015/076124
§ 371 (c)(1),
(2) Date: Feb. 6, 2017

(87) PCT Pub. No.: WO2016/043183
PCT Pub. Date: Mar. 24, 2016

(65) Prior Publication Data
US 2017/0233863 A1 Aug. 17, 2017

(30) Foreign Application Priority Data

Sep. 18, 2014 (JP) .................................. 2014-190278
Sep. 7, 2015 (JP) .................................. 2015-175725

(51) Int. Cl.
*C23C 14/34* (2006.01)
*C22C 5/08* (2006.01)
(Continued)

(52) U.S. Cl.
CPC .......... *C23C 14/3414* (2013.01); *B22D 7/005* (2013.01); *C22C 5/08* (2013.01);
(Continued)

(58) Field of Classification Search
CPC ..... C23C 14/3414; C23C 14/14; B22D 7/005; C22C 5/08; C22F 1/14; H01J 37/3429
See application file for complete search history.

(56) References Cited

U.S. PATENT DOCUMENTS 6,514,628 B1 * 2/2003 Ueno .................. F21S 48/1394
362/296.02
2013/0264200 A1 10/2013 Schlott et al.
(Continued)

FOREIGN PATENT DOCUMENTS

CN 1550573 A 12/2004
JP 06-172894 A 6/1994
(Continued)

OTHER PUBLICATIONS

Machine translation of JP 2012/207445A, obtained from J-Platpat service of the JPO.*
(Continued)

*Primary Examiner* — John J Brayton
(74) *Attorney, Agent, or Firm* — Locke Lord LLP

(57) ABSTRACT

An Ag alloy sputtering target of the present invention includes, as a composition, 0.1 at % to 3.0 at % of Sn, 1.0 at % to 10.0 at % of Cu, and a balance of Ag and inevitable impurities. In addition, an Ag alloy film of the present invention includes, as a composition, 0.1 at % to 3.0 at % of Sn, 1.0 at % to 10.0 at % of Cu, and a balance of Ag and inevitable impurities.

5 Claims, 2 Drawing Sheets

(51) Int. Cl.
  *C23C 14/14*   (2006.01)
  *C22F 1/14*   (2006.01)
  *B22D 7/00*   (2006.01)
  *H01J 37/34*   (2006.01)
(52) U.S. Cl.
  CPC ............... *C22F 1/14* (2013.01); *C23C 14/14* (2013.01); *H01J 37/3429* (2013.01)

(56) References Cited

U.S. PATENT DOCUMENTS

2014/0342104 A1* 11/2014 Tauchi ..................... C22C 5/06
                                                       428/1.4
2017/0191154 A1* 7/2017 Toshimori ............... C23C 14/14

FOREIGN PATENT DOCUMENTS

| JP | 06-220555 | A | 8/1994 |
| JP | 07-114841 | A | 5/1995 |
| JP | 2003055721 | A | 2/2003 |
| JP | 2004-002929 | A | 1/2004 |
| JP | 2005-332557 | A | 12/2005 |
| JP | 2006-328353 | A | 12/2006 |
| JP | 2007-504593 | A | 3/2007 |
| JP | 2009-024212 | A | 2/2009 |
| JP | 2012-207445 | A | 10/2012 |
| JP | 2013-216976 | A | 10/2013 |
| JP | 201343936 | A | 11/2013 |
| JP | 2014-139339 | A | 7/2014 |
| JP | 2014196562 | A * | 10/2014 |
| WO | 2005/024070 | A2 | 3/2005 |
| WO | 2006/132413 | A1 | 12/2006 |
| WO | 2013/105285 | A1 | 9/2017 |

OTHER PUBLICATIONS

Office Action dated Mar. 21, 2017, issued for the Japanese patent application No. 2015-175725 and English translation thereof.
Notice of Allowance dated Jun. 6, 2017, issued for the Japanese Patent Application No. 2015-175725 and English translation thereof.
International Search Report dated Dec. 8, 2015, issued for PCT/JP2015/076124 and English translation thereof.
Office Action dated Oct. 25, 2016, issued for the Japanese patent application No. 2015-175725 and English translation thereof.
Office Action dated Sep. 4, 2017, issued for the Chinese patent application No. 201580042235.X and English translation thereof.
Office Action dated Nov. 28, 2017, issued for the Taiwanese patent application No. 104130823 and English translation thereof.
Office Action dated Oct. 10, 2017, issued for the Japanese patent application No. 2017-033979 and English translation thereof.
The extended European search report dated Jun. 7, 2018 issued for corresponding European Patent Application No. 15842240.2.

* cited by examiner

AG ALLOY SPUTTERING TARGET, METHOD OF MANUFACTURING AG ALLOY SPUTTERING TARGET, AG ALLOY FILM, AND METHOD OF FORMING AG ALLOY FILM

TECHNICAL FIELD

The present invention relates to an Ag alloy sputtering target for forming an Ag alloy film, which is applicable to, for example, a metal thin film for a transparent conducting film or an optical functional film for a display or a touch panel, a method of manufacturing an Ag alloy sputtering target, an Ag alloy film, and a method of forming an Ag alloy film.

Priority is claimed on Japanese Patent Application No. 2014-190278, filed Sep. 18, 2014 and Japanese Patent Application No. 2015-175725, filed Sep. 7, 2015, the contents of which are incorporated herein by reference.

BACKGROUND ART

In general, a patterned transparent conducting film is widely used in an electronic device such as a touch panel, a solar cell, or an organic light-emitting diode device. Ag or an Ag alloy obtained by adding another element to Ag is a material having excellent electrical conductivity, and in a case where a thin film is formed using Ag or an Ag alloy, high transmittance can be obtained. Therefore, application of Ag or an Ag alloy to a transparent conducting film in the above electronic devices has been expected (refer to PTL 1).

In addition, in the fields of heat ray cutting, a display device, and the like, an optical functional film is used. As such an optical functional film, a transparent laminated film so-called a multi-layer film type is known, in which a high refractive index thin film formed of a metal oxide and a metal thin film are alternately laminated on a single surface of a transparent polymer film. As a material of the metal thin film of the optical functional film, Ag or an Ag alloy is used (refer to PTL 2).

However, Ag or an Ag alloy has a problem in that deterioration in properties and a change (for example, speckles) in the external appearance of a film formed of Ag or an Ag alloy are likely to occur due to corrosion caused by humidity, sulfur, and the like in environment during the manufacturing process and during usage. In a case where a film formed of Ag or an Ag alloy has a thickness (15 nm or less) of a semi-transparent film or the like, the above phenomenon appears more significantly, and there is a problem in that the formation of speckles may occur due to aggregation which may occur by particles being deposited on a surface of the film.

PTL 3 and PTL 4 disclose an Ag alloy film in which environment resistance is improved.

PTL 3 discloses an Ag alloy film obtained by adding a noble metal such as platinum, palladium, gold, rhodium, ruthenium, or iridium to Ag.

In addition, PTL 4 discloses an Ag alloy film including Bi and at least one selected from Zn, Al, Ga, In, Si, Ge, and Sn.

CITATION LIST

Patent Literature

[PTL 1] Japanese Unexamined Patent Application, First Publication No. H7-114841

[PTL 2] Japanese Unexamined Patent Application, First Publication No. 2006-328353

[PTL 3] Republished Japanese Translation No. WO2006/132413 of the PCT International Publication for Patent Applications

[PTL 4] Japanese Unexamined Patent Application, First Publication No. 2005-332557

SUMMARY OF INVENTION

Technical Problem

However, in the Ag alloy film described in PTL 3, a noble metal is used as an additive element. Therefore, there is a problem in that the material costs are high.

In addition, in the Ag alloy film described in PTL 4, an absorptance is relatively high, and optical properties are insufficient.

In particular, in the above-described metal thin film for the transparent conducting film or the optical functional film, recently, further improvement in luminous transmittance has been required, and a conventional Ag alloy film cannot meet this requirement. In addition, in a transparent conducting film used in an electronic device such as an organic light-emitting diode device, excellent electrical conductivity (electrical properties) are also required.

The present invention has been made in consideration of the above-described circumstances, and an object thereof is to provide an Ag alloy sputtering target with which an Ag alloy film having excellent electrical properties, optical properties, and environment resistance can be formed, a method of manufacturing an Ag alloy sputtering target, an Ag alloy film, and a method of forming an Ag alloy film.

Solution to Problem

According to a first aspect of the present invention for solving the above-described problems, there is provided an Ag alloy sputtering target including, as a composition, 0.1 at % to 3.0 at % of Sn, 1.0 at % to 10.0 at % of Cu, and a balance of Ag and inevitable impurities.

The Ag alloy sputtering target according to the first aspect of the present invention includes, as a composition 0.1 at % to 3.0 at % of Sn, 1.0 at % to 10.0 at % of Cu, and a balance of Ag and inevitable impurities. Therefore, Ag aggregation can be prevented, and an Ag alloy film having significantly improved environment resistance can be formed. In addition, by adding Sn, deterioration in optical properties of the Ag alloy film in a hot humid environment can be prevented. Further, by adding Cu, deterioration in electrical properties of the Ag alloy film in a hot humid environment can be prevented.

Here, in the Ag alloy sputtering target according to the first aspect of the present invention, it is preferable that a total amount of Na, Si, V, Cr, Fe, and Co among the inevitable impurities is 100 mass ppm or lower.

In this case, the total amount of Na, Si, V, Cr, Fe, and Co, which are elements having low solid solubility to Ag, among the inevitable impurities is limited to 100 mass ppm or lower. Therefore, segregation of the elements in a grain boundary can be prevented, and the occurrence of abnormal discharge during sputtering can be reduced.

In addition, similarly, in the formed Ag alloy film, the segregation of the above elements in a grain boundary is prevented, and deterioration in environment resistance of the Ag alloy film can be prevented.

Here, in the Ag alloy sputtering target according to the first aspect of the present invention, it is preferable that the amount of each of Na, Si, V, Cr, Fe, and Co among the inevitable impurities is 30 mass ppm or lower.

In this case, the amount of each of Na, Si, V, Cr, Fe, and Co, which are elements having low solid solubility to Ag, is limited to 30 mass ppm or lower. Therefore, the occurrence of abnormal discharge during sputtering can be reliably reduced. In addition, similarly, in the formed Ag alloy film, deterioration in environment resistance can be reliably prevented.

Here, in the Ag alloy sputtering target according to the first aspect of the present invention, it is preferable that an average crystal grain size on a sputtering surface is 200 or less and that a grain size of a segregation formed of Cu, Sn, or an intermetallic compound of Cu and Sn is less than 1 μm.

In this case, the average crystal grain size is adjusted to be 200 μm or less. Therefore, unevenness of the sputtering surface, which may occur due to a variation in sputtering rate caused by crystal orientations when the sputtering surface is consumed by sputtering, can be reduced, and the occurrence of abnormal discharge can be reduced.

Further, the grain size of the segregation formed of Cu, Sn, or an intermetallic compound of Cu and Sn is less than 1 μm. Therefore, the sputtering rate and the component composition in the formed Ag alloy film during long-term sputtering can be stabilized. It is more preferable that the segregation is not present in the structure.

Here, it is preferable that the Ag alloy sputtering target according to the first aspect of the present invention further includes 0.1 at % to 3.0 at % of Ti.

In this case, 0.1 at % or higher of Ti is added. Therefore, resistance of the formed Ag alloy film to chemicals can be significantly improved. In addition, the addition amount of Ti is limited to 3.0 at % or lower. Therefore, deterioration in optical properties and electrical properties of the formed Ag alloy film can be prevented.

According to a second aspect of the present invention, there is a provided a method of manufacturing an Ag alloy sputtering target which is a method of manufacturing the above-described Ag alloy sputtering target (including, as a composition, 0.1 at % to 3.0 at % of Sn, 1.0 at % to 10.0 at % of Cu, and a balance of Ag and inevitable impurities, in which an average crystal grain size on a sputtering surface is 200 μm or less, and a grain size of a segregation formed of Cu, Sn, or an intermetallic compound of Cu and Sn is less than 1 μm). This method includes: a melting and casting step of preparing an Ag alloy ingot; a rolling step of rolling the obtained Ag alloy ingot; and a heat treatment step of performing a heat treatment after rolling, in which a heat treatment temperature in the heat treatment step is in a range of 650° C. to 750° C.

According to the method of manufacturing an Ag alloy sputtering target having the above-described configuration, the heat treatment temperature in the heat treatment step is 650° C. or higher. Therefore, Cu and Sn can be diffused such that segregation thereof can be eliminated, and a segregation formed of Cu, Sn, or an intermetallic compound thereof can be reduced. In addition, the heat treatment temperature in the heat treatment step is 750° C. or lower. Therefore, the coarsening of crystal grains can be prevented.

An Ag alloy film according to a third aspect of the present invention includes: as a composition, 0.1 at % to 3.0 at % of Sn, 1.0 at % to 10.0 at % of Cu, and a balance of Ag and inevitable impurities.

The Ag alloy film having the above-described configuration includes, as a composition, 0.1 at % to 3.0 at % of Sn, 1.0 at % to 10.0 at % of Cu, and a balance of Ag and inevitable impurities. Therefore, electrical properties, environment resistance, and optical properties are excellent, and the Ag alloy film according to the third aspect is particularly suitable as, for example, a metal thin film for a transparent conducting film or an optical functional film.

In the Ag alloy film according to the third aspect of the present invention, it is preferable that a luminous transmittance is 70% or higher and that a luminous absorptance is 10% or lower.

In this case, visibility is excellent, and thus the Ag alloy film according to the third aspect can be suitably used as a metal thin film for a transparent conducting film or an optical functional film for various displays or touch panels.

In the Ag alloy film according to the third aspect of the present invention, it is preferable that a sheet resistance value is 40 Ω/sq. or lower.

In this case, the Ag alloy film according to the third aspect can be used as a transparent conducting film having excellent electrical conductivity in an electrode film or a wiring film for various displays or touch panels.

In the Ag alloy film according to the third aspect of the present invention, it is preferable that a thickness of the film is in a range of 4 nm to 10 nm.

In this case, the thickness of the Ag alloy film is 4 nm or more. Therefore, the electrical resistance can be reliably reduced, and the electrical conductivity can be secured. In addition, the thickness of the Ag alloy film is 10 nm or less. Therefore, the luminous transmittance can be reliably improved.

According to a fourth aspect of the present invention, there is provided a method of forming an Ag alloy film, in which the Ag alloy film is formed using the Ag alloy sputtering target according to the first aspect of the present invention.

According to the method of forming an Ag alloy film having the above-described configuration, an Ag alloy film including Cu and Sn and having excellent electrical properties, environment resistance, and optical properties can be formed.

Advantageous Effects of Invention

According to the present invention, an Ag alloy sputtering target with which an Ag alloy film having excellent electrical properties, optical properties, and environment resistance can be formed, a method of manufacturing an Ag alloy sputtering target, an Ag alloy film, and a method of forming an Ag alloy film can be provided.

DESCRIPTION OF EMBODIMENTS

Figure 1:
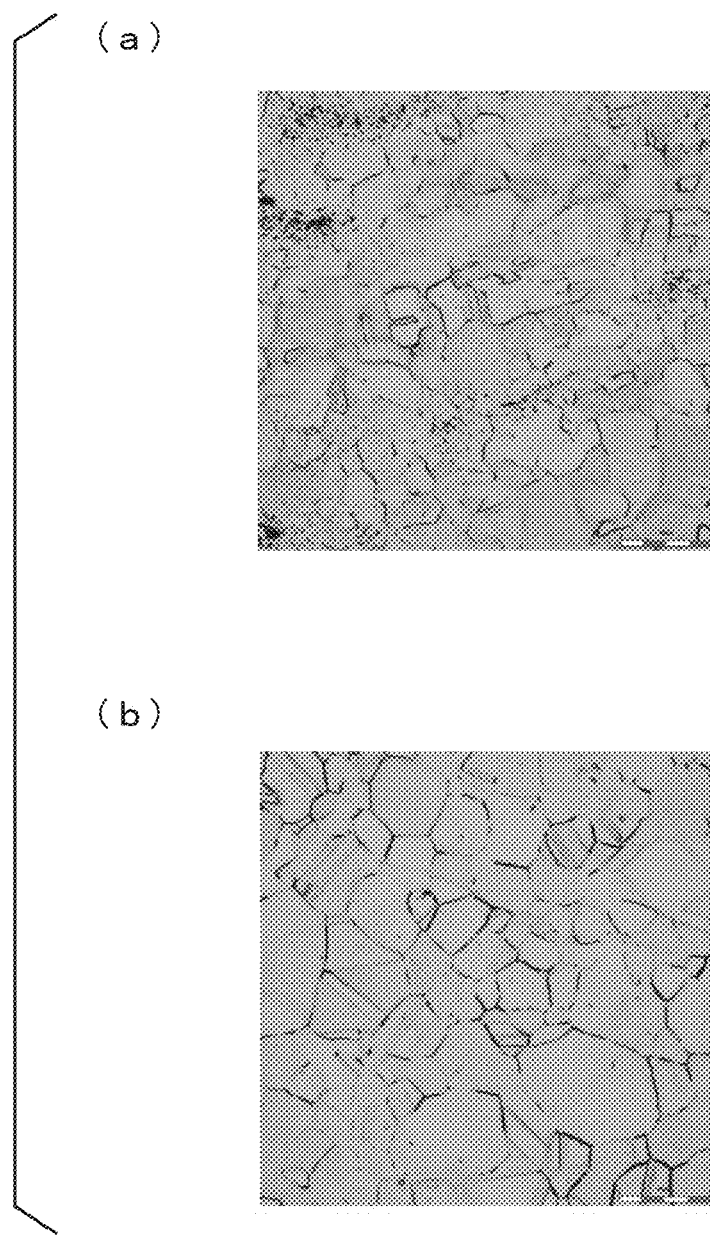
FIG. 1 shows structure images of Ag alloy sputtering targets according to Examples, in which:
  (a) shows an Ag alloy sputtering target according to Example 1; and
  (b) shows an Ag alloy sputtering target according to Example 26.

Hereinafter, an Ag alloy sputtering target and an Ag alloy film according to an embodiment of the present invention will be described.

The Ag alloy sputtering target according to the embodiment is used for forming an Ag alloy film. Here, the Ag alloy film according to the embodiment is used as, for example, a metal thin film for a transparent conducting film or an optical functional film in an electronic device such as a touch panel, a solar cell, or an organic light-emitting diode device.

<Ag Alloy Sputtering Target>

The Ag alloy sputtering target according to the embodiment is formed of an Ag alloy having a composition which includes 0.1 at % to 3.0 at % of Sn, 1.0 at % to 10.0 at % of Cu, and a balance of Ag and inevitable impurities.

In addition, in the embodiment, a total amount of Na, Si, V, Cr, Fe, and Co among the inevitable impurities is 100 mass ppm or lower. In addition, the amount of each of Na, Si, V, Cr, Fe, and Co among the inevitable impurities is 30 mass ppm or lower. Optionally, the Ag alloy sputtering target may further include 0.1 at % to 3.0 at % of Ti.

In addition, in the Ag alloy sputtering target according to the embodiment, the average crystal grain size on a sputtering surface is 200 μm or less, and the grain size of a segregation formed of Cu, Sn, or an intermetallic compound of Cu and Sn is less than 1 μm.

Hereinafter, the reason for limiting the composition and the crystal structure of the Ag alloy sputtering target according to the embodiment as described above will be described.

(Sn: 0.1 at % to 3.0 at %)

Sn is an element which has an effect of improving environment resistance of the formed Ag alloy film. In particular, Sn has an effect of effectively preventing deterioration in optical properties in a hot humid environment.

Here, in a case where the Sn content in the Ag alloy sputtering target is lower than 0.1 at %, the above-described effects may be insufficiently exhibited. On the other hand, in a case where the Sn content in the Ag alloy sputtering target is higher than 3.0 at %, electrical properties of the formed Ag alloy film may deteriorate.

Due to the above-described reasons, in the embodiment, the Sn content in the Ag alloy sputtering target is set in a range of 0.1 at % to 3.0 at %. In order to reliably exhibit the above-described effects, it is preferable that the lower limit of the Sn content in the Ag alloy sputtering target is set to be 0.4 at % or higher and the upper limit thereof is set to be 2.0 at % or lower.

(Cu: 1.0 at % to 10.0 at %)

Cu is an element which has an effect of improving environment resistance of the formed Ag alloy film. In particular, Cu has an effect of effectively preventing deterioration in electrical properties in a hot humid environment. In addition, Cu has an effect of preventing the formation of speckles or the like in the formed Ag alloy film in a hot humid environment.

Here, in a case where the Cu content in the Ag alloy sputtering target is lower than 1.0 at %, the above-described effects may be insufficiently exhibited. On the other hand, in a case where the Cu content in the Ag alloy sputtering target is higher than 10.0 at %, electrical properties of the formed Ag alloy film may deteriorate. In addition, the absorptance of the formed Ag alloy film increases, which may lead to deterioration in optical properties.

Due to the above-described reasons, in the embodiment, the Cu content in the Ag alloy sputtering target is set in a range of 1.0 at % to 10.0 at %. In order to reliably exhibit the above-described effects, it is preferable that the lower limit of the Cu content in the Ag alloy sputtering target is set to be 2.0 at % and the upper limit thereof is set to be 8.0 at %.

(Na, Si, V, Cr, Fe, Co: Total Amount is 100 Mass ppm or Lower; Amount of Each Element is 30 Mass ppm or Lower)

Na, Si, V, Cr, Fe, and Co among the inevitable impurities have low solid solubility in Ag and, thus segregate in a grain boundary of the Ag alloy sputtering target and react with oxygen to form oxides. By the oxides being present in the Ag alloy sputtering target, abnormal discharge and splash may occur during sputtering. In addition, the elements such as Na, Si, V, Cr, Fe, and Co are likely to segregate in a grain boundary of the formed Ag alloy film. Therefore, in a hot humid environment, the elements are oxidized, which may cause deterioration in the crystallinity of the Ag alloy film and deterioration in environment resistance.

Due to the above-described reasons, in the embodiment, the total amount of Na, Si, V, Cr, Fe, and Co among the inevitable impurities in the Ag alloy sputtering target is limited to 100 mass ppm or lower. In addition, in order to further reduce the number of times of abnormal discharge, in the embodiment, the amount of each of Na, Si, V, Cr, Fe, and Co among the inevitable impurities is limited to 30 mass ppm or lower. It is preferable that the total amount of Na, Si, V, Cr, Fe, and Co among the inevitable impurities is 20 mass ppm or lower. Further, it is preferable that the amount of each of Na, Si, V, Cr, Fe, and Co among the inevitable impurities is 10 mass ppm or lower.

(Ti: 0.1 at % to 3.0 at %)

By adding Ti, resistance to chemicals is improved. Specifically, sulfur resistance and chlorine resistance of the formed Ag alloy film can be improved.

Here, in a case where the Ti content is lower than 0.1 at %, the above-described effects may be insufficiently exhibited. On the other hand, in a case where the Ti content is higher than 3.0 at %, optical properties and electrical properties of the formed Ag alloy film may deteriorate.

Due to the above-described reasons, in the embodiment, in a case where Ti is added, the Ti content is set in a range of 0.1 at % to 3.0 at %.

(Average Crystal Grain Size on Sputtering Surface: 200 μm or Less)

The sputtering rate varies depending on crystal orientations. Therefore, as sputtering progresses, unevenness corresponding to crystal grains is formed on the sputtering surface due to the variation in sputtering rate described above. Here, in a case where the average crystal grain size on the sputtering surface is more than 200 μm, unevenness formed on the sputtering surface becomes significant, electric charges are concentrated on protruded portions, and abnormal discharge is likely to occur.

Due to the above-described reasons, in the Ag alloy sputtering target according to the embodiment, the average crystal grain size of the sputtering surface is limited to be 200 μm or less.

In order to reliably prevent the unevenness of the sputtering surface during sputtering and to reliably prevent abnormal discharge, the average crystal grain size on the sputtering surface is preferably 150 μm or less and more preferably 80 μm or less. The lower limit value of the average crystal grain size is not particularly limited and is preferably 30 μm and more preferably 50 μm.

Here, in the embodiment, rectangular-parallelepiped samples having a side length of about 10 mm are collected evenly from 16 portions in the sputtering surface to measure the average crystal grain size. Specifically, the target is divided into 16 portions of 4 (vertical)×4 (horizontal), and the sample is collected from the center of each of the portions. In the embodiment, the method of collecting the samples from the rectangular target which is generally used as a large target has been described. However, of course, the present invention is also effective for reducing the occurrence of splash of a circular target. At this time, samples are collected evenly from 16 portions in a sputtering surface of the circular target using the method of collecting samples from a large rectangular target.

(Grain Size of Segregation Formed of Cu, Sn, or Intermetallic Compound Thereof: Less than 1 μm)

In the Ag alloy sputtering target comprising, as a composition, 0.1 at % to 3.0 at % of Sn, 1.0 at % to 10.0 at % of Cu, and a balance of Ag and inevitable impurities, a segregation formed of Cu, Sn, or an intermetallic compound thereof may be present. Here, in a case where the grain size of the segregation is more than 1 μm, the sputtering rate during long-term sputtering is unstable, which may cause a dispersion in the composition of the formed Ag alloy film.

Due to the above-described reasons, in the Ag alloy sputtering target according to the embodiment, the grain size of the segregation formed of Cu, Sn, or an intermetallic compound thereof is limited to be less than 1 μm.

In order to reliably stabilize the sputtering rate during long-term sputtering and to reliably reduce a dispersion in the composition of the formed Ag alloy film, it is more preferable that the segregation formed of Cu, Sn, or an intermetallic compound thereof is not present in the structure.

<Method of Manufacturing Ag Alloy Sputtering Target>

Next, the method of manufacturing an Ag alloy sputtering target according to the embodiment will be described.

First, as melting raw materials, Ag having a purity of 99.9 mass % or higher and Cu and Sn having a purity of 99.9 mass % or higher are prepared. In a case where Ti is added, Ti having a purity of 99.9 mass % or higher is prepared.

Here, in order to reliably reduce the amounts of Na, Si, V, Cr, Fe, and Co among the inevitable impurities, these elements included in the Ag raw material are analyzed by ICP analysis or the like to selectively use the Ag raw material. In order to reliably reduce the amounts of Na, Si, V, Cr, Fe, and Co among the inevitable impurities, it is preferable to leach the Ag raw material in, for example, nitric acid or sulfuric acid and then to electrorefine the Ag raw material using an electrolytic solution having a predetermined Ag concentration.

The selected Ag raw material, the Cu raw material, and the Sn raw material are weighed such that a predetermined composition is obtained. Next, in a melting furnace, Ag is melted in a high vacuum or in an inert gas atmosphere, Cu and Sn having predetermined amounts are added to the molten Ag, and Ti is optionally further added thereto. Next, they are melted in a vacuum or in an inert gas atmosphere to prepare an Ag alloy ingot including 0.1 at % to 3.0 at % of Sn, 1.0 at % to 10.0 at % of Cu, and a balance of Ag and inevitable impurities and optionally further including 0.1 at % to 3.0 at % of Ti (melting and casting step).

Next, the obtained Ag alloy ingot is cold-rolled (rolling step). It is preferable a rolling reduction in the rolling step is in a range of 60% to 80%.

Next, a heat treatment is performed after rolling (heat treatment step). A heat treatment temperature in the heat treatment step is in a range of 650° C. to 750° C. It is preferable that a holding time at the heat treatment temperature is in a range of 60 min to 180 min.

Next, by performing machining, the Ag alloy sputtering target according to the embodiment is manufactured. The shape of the Ag alloy sputtering target is not particularly limited and may be a disk shape, an angular plate shape, or a cylindrical shape.

<Ag Alloy Film>

The Ag alloy film according to the embodiment is used using the Ag alloy sputtering target according to the embodiment and has the same component composition as that of the Ag alloy sputtering target.

Regarding optical properties of the Ag alloy film, in a visible light region, a luminous transmittance is 70% or higher, and a luminous absorptance is 10% or lower.

Regarding electrical properties of the Ag alloy film, a sheet resistance value is 40 Ω/sq. or lower.

In addition, a thickness of the Ag alloy film according to the embodiment is in a range of 4 nm to 10 nm.

Here, in a case where the thickness of the Ag alloy film is less than 4 nm, electrical properties may not be maintained. In addition, since the film is likely to coagulate, environment resistance may deteriorate. On the other hand, in a case where the thickness of the Ag alloy film is more than 10 nm, optical properties such as absorptance may deteriorate.

Due to the above-described reasons, in the embodiment, the thickness of the Ag alloy film is set in a range of 4 nm to 10 nm. The lower limit of the thickness of the Ag alloy film is preferably 6 nm, and the upper limit of the thickness of the Ag alloy film is preferably 8 nm.

In a case where the Ag alloy film according to the embodiment is formed, a magnetron sputtering method is preferably used, and a power source can be selected from a direct current (DC) power source, a high-frequency (RF) power source, a mid-frequency (MF) power source, and an alternating current (AC) power source.

As a substrate for film formation, for example, a glass plate or foil, a metal plate or foil, a resin plate or film can be used. In addition, regarding the disposition of the substrate during film formation, for example, a stationary facing type or an in-line type can be adopted.

The Ag alloy sputtering target according to the embodiment which is configured as described above includes, as a composition, 0.1 at % to 3.0 at % of Sn, 1.0 at % to 10.0 at % of Cu, and a balance of Ag and inevitable impurities. Therefore, the Ag alloy film in which environment resistance is significantly improved can be formed. Specifically, deterioration in optical properties and electrical properties of the Ag alloy film in a hot humid environment can be prevented.

Further, in the Ag alloy sputtering target according to the embodiment, the total amount of Na, Si, V, Cr, Fe, and Co, which are elements having low solid solubility to Ag, among the inevitable impurities is limited to 100 mass ppm or lower. Therefore, the formation of oxides caused by segregation of the elements in a grain boundary can be prevented, and the occurrence of abnormal discharge and splash during sputtering can be reduced.

In addition, similarly, in the formed Ag alloy film, the segregation of the above elements in a grain boundary is prevented, and deterioration in environment resistance of the Ag alloy film can be prevented.

In addition, in the Ag alloy sputtering target according to the embodiment, the amount of each of Na, Si, V, Cr, Fe, and Co among the inevitable impurities is limited to 30 mass ppm or lower. Therefore, the occurrence of abnormal discharge and splash during sputtering can be reliably reduced.

In addition, similarly, in the formed Ag alloy film, deterioration in environment resistance of the Ag alloy film can be prevented.

The Ag alloy film according to the embodiment is formed using the Ag alloy sputtering target according to the embodiment and has the same component composition as the Ag alloy sputtering target according to the embodiment. Therefore, electrical properties, environment resistance, and optical properties are excellent, and the Ag alloy film according to the embodiment is particularly suitable as, for example, a metal thin film for a transparent conducting film or an optical functional film.

Specifically, regarding optical properties, a luminous transmittance is 70% or higher, and a luminous absorptance is 10% or lower. Therefore, as a transparent film having excellent visibility, the Ag alloy film according to the embodiment can be used.

In addition, regarding electrical properties, a sheet resistance value is 40 Ω/sq. or lower. Therefore, as a conductive film having excellent electrical conductivity, the Ag alloy film according to the embodiment can be used.

Further, the thickness of the Ag alloy film according to the embodiment is set in a range of 4 nm to 10 nm. Therefore, aggregation is prevented, and environment resistance can be secured. In addition, electrical properties and optical properties can be secured.

Hereinabove, the embodiment of the present invention has been described. However, the present invention is not limited to the embodiment, and various modifications can be made within a range not departing from the technical ideas of the present invention.

In the above-described description of the embodiment, the Ag alloy film according to the embodiment is used as, for example, a metal thin film for a transparent conducting film or an optical functional film in an electronic device such as a touch panel, a solar cell, or an organic light-emitting diode device. However, the Ag alloy film according to the embodiment is not limited to the above-described applications and can be used in other applications.

In addition, the thickness of the Ag alloy film is not limited to the embodiment and may be appropriately changed depending on the intended use.

Examples

Hereinafter, the results of an experiment for verifying the effectiveness of the present invention will be described.

<Sputtering Target for Forming Ag Alloy Film>

First, as melting raw materials, Ag having a purity of 99.9 mass % or higher and Cu, Sn, and Ti having a purity of 99.9 mass % or higher were prepared. Here, in order to reduce the amount of each of impurities, a method of leaching the Ag raw material in nitric acid or sulfuric acid and then electrorefining the leached Ag raw material using an electrolytic solution having a predetermined Ag concentration was adopted. On the Ag raw material with reduced impurities in this refining method, impurity analysis using ICP was performed. Then, an Ag raw material in which the total concentration (total amount) of Na, Si, V, Cr, Fe, and Co was 100 ppm or lower and the amount of each of the elements was 30 ppm was selected as a raw material for manufacturing a sputtering target.

The selected Ag raw material and Cu, Sn, and Ti to be added to Ag were weighed such that a predetermined composition was obtained. Next, Ag was melted in a high vacuum or in an inert gas atmosphere, Cu, Sn, and Ti were added to the molten Ag, and the elements were melted in a high vacuum or in an inert gas atmosphere. Next, the molten alloy was poured into a mold to prepare an Ag alloy ingot. Here, during the melting of Ag, the atmosphere was temporarily set as a vacuum ($5\times10^{-2}$ Pa or lower) and then is replaced with Ar gas. In addition, the addition of Cu, Sn, and Ti was performed in an Ar gas atmosphere.

Next, the obtained Ag alloy ingot was cold-rolled at a rolling reduction of 70%.

Next, in air, a heat treatment of holding the rolled Ag alloy ingot at a temperature shown in Table 2 for 1 hour was performed. Next, by performing machining, an Ag alloy sputtering target having a diameter of 152.4 mm and a thickness of 6 mm was prepared.

In each of Ag alloy sputtering targets according to Examples 8 to 16, appropriate amounts of Na, Si, V, Cr, Fe, and Co were intentionally added during melting. In addition, in each of Ag alloy sputtering targets according to Examples 20 to 23, 30, and 31, an Ag raw material which did not undergone the electrorefining and selection of the Ag alloy was used.

(Composition Analysis)

A sample for analysis was collected from each of the Ag alloy ingots after casting, and the collected sample was analyzed by ICP atomic emission spectrometry. The analysis results are shown in Table 1.

(Crystal Grain Size)

A sputtering surface of the obtained Ag alloy sputtering target was divided into eight equal portions by line segments passing through the center of the sputtering surface, and a sample was collected from the center of each of the eight portions. A surface of each of the sample on the sputtering surface side was polished. The surface was polished with waterproof paper of #180 to #4000 and then was further buffed with abrasive grain of 3 μm to 1 μm.

Next, the sample was etched such that a grain boundary was able to be observed with an optical microscope. Here, the sample was immersed in a mixed solution of hydrogen peroxide water and ammonia water as an etchant at room temperature for 1 to 2 seconds such that a grain boundary appeared. Next, each sample was imaged using an optical microscope at a magnification of 30 times.

In each image, four 60 mm line segments in total were horizontally and vertically drawn in a lattice shape at an interval of 20 mm, and the number of crystal grains cut by each of the lines was counted. The number of crystal grain at each edge of the line segment was counted as 0.5. An average cut length L (μm) was obtained from "L=60000/(M·N)" (where M represents an actual magnification, and N represents the average number of cut crystal grains). Based on the obtained average cut length L an average grain size d (μm) of the sample was obtained from "d=(3/2)·L". The evaluation results are shown in Table 2.

(Whether or Not Segregation Having Grain Size of 1 μm or More was Present)

A sample was prepared using the same method as that used in the measurement of the crystal grain size and was imaged using an optical microscope at a magnification of 1500 times, and whether or not a segregation having a grain size of 1 μm or more was present was determined. The evaluation results are shown in Table 2.

FIG. 1 shows an example of the result of observing the segregation. In FIG. 1, (a) shows the result of observing an Ag alloy sputtering target according to Example 1; and (b) shows the result of observing an Ag alloy sputtering target according to Example 26. In the Ag alloy sputtering target according to Example 1, segregations were observed as dark spots.

(Number of Times of Abnormal Discharge in Initial Period of Use)

Each of the Ag alloy sputtering targets according to the above-described Examples and Comparative Examples was soldered to a back plate formed of oxygen free copper using an indium solder to prepare a target composite.

The target composite was mounted on a usual magnetron sputtering device and was evacuated into $5\times10^{-5}$ Pa, and then sputtering was performed under conditions of Ar gas pressure: 0.5 Pa, power input: DC 1000 W, and distance between the target and a substrate: 70 mm. The number of times of abnormal discharge occurred during sputtering for a period of 1 hour from the start of discharge was counted using an arc counting function of a DC power supply (RPDG-50A, manufactured by MKS Instruments Inc.). The evaluation results are shown in Table 2.

(Number of Times of Abnormal Discharge After Long-Term Sputtering)

The target was consumed by performing intermittent sputtering for 20 hours while repeating sputtering for four hours and exchange of an adhesion shield plate. Next, sputtering was further performed under the above-described conditions, and the number of times of abnormal discharge occurred for a period of 1 hour after the consumption (20-hour sputtering) was counted. The evaluation results are shown in Table 2.

(Change Ratio Between Sputtering Rates Before and After Long-Term Sputtering)

After measuring the sputtering rate in an initial period of use, using the same method as described above, the target was consumed by performing intermittent sputtering for 20 hours while repeating sputtering for four hours and exchange of an adhesion shield plate. Next, sputtering was further performed, the sputtering rate was measured, and the change ratio between the sputtering rates was evaluated based on the following expression. The evaluation results are shown in Table 2.

Change ratio between sputtering rates=Rate after long-term sputtering/Rate in initial period of use (Change Rate Between Film Compositions Before and After Long-Term Sputtering)

The composition of an Ag alloy film formed in an initial period of use was measured. As a method of measuring the composition of the film, an Ag alloy film having a thickness of 3000 nm was formed, and this formed Ag alloy film was measured by ICP spectrometry. Then, using the same method as described above, the target was consumed by performing intermittent sputtering for 20 hours while repeating sputtering for four hours and exchange of an adhesion shield plate. Next, sputtering was further performed, the composition of the formed Ag alloy film was measured, and a change rate between the film compositions was evaluated based on the following expression. The evaluation results are shown in Table 2.

Change rate between film compositions (%)=(Composition additive element $A$ after long-term sputtering/Composition additive element $A$ in initial period of use)×100

As the additive element A, an additive element having the highest change rate among the additive elements was used.

<Ag Alloy Film>

Each of the Ag alloy sputtering targets according to Examples and Comparative Examples was mounted in a sputtering device, and an Ag alloy film was formed under the following conditions.

Substrate: washed glass substrate (EAGLE XG, manufactured by Corning Inc., thickness: 0.7 mm)
Peak vacuum degree: $5\times10^{-5}$ Pa or lower
Gas used: Ar
Gas pressure: 0.5 Pa
Sputtering power: DC 200 W
Distance between target and substrate: 70 mm (Measurement of Film Thickness)

An observation sample was prepared using a cross-section polisher (CP), a cross-section of the Ag alloy film was observed using a transmission electron microscope (TEM), and then the thickness of the Ag alloy film was calculated. Table 3 shows the film structure.

(Thermo-Hygrostat Test)

The formed Ag alloy film was left to stand in a Thermo-Hygrostat bath at a temperature of 85% and a humidity of 85% for 250 hours.

(Sheet Resistance Value)

A sheet resistance value $R_{S0}$ of the formed Ag alloy film, and a sheet resistance value $R_{S1}$ of the Ag alloy film having undergone the Thermo-Hygrostat test were measured using a four-point probe method with a resistance measuring device (LORESTA GP manufactured by Mitsubishi Chemical Corporation). In addition, the change rate (%) before and after the Thermo-Hygrostat test was calculated from the following expression. The measurement results are shown in Tables 3 and 4.

Change rate (%)=$(R_{S1}-R_{S0})/R_{S0}\times100$ (Luminous Transmittance)

The luminous transmittance of the Ag alloy film was measured using a spectrophotometer (U-4100, manufactured by Hitachi High-Technologies Corporation), and the transmittance of the film was evaluated relative to 100 of the transmittance of the substrate on which a thin film was not formed. A transmittance spectrum % T was measured in a wavelength range of 780 to 380 nm. In this spectrum, a Y value in the XYZ colorimetric system was calculated under conditions of light source: D65 and viewing angle: 2° using a color calculator program (according to MS Z 8722). The calculated value was set as the luminous transmittance.

A luminous transmittance $T_0$ of the formed Ag alloy film and a luminous transmittance $T_1$ of the Ag alloy film having undergone the Thermo-Hygrostat test were measured as described above. In addition, a change amount $T_1-T_0$ before and after the Thermo-Hygrostat test was calculated. The measurement results are shown in Tables 3 and 4.

(Luminous Absorptance)

Regarding the luminous absorptance of the Ag alloy film, an absorptance spectrum % A was calculated from the following expression based on the above-described transmittance spectrum % T measured using the spectrophotometer and a reflectance spectrum % R which was measured in a wavelength range of 780 to 380 nm.

% $A$=100−(% $T$+% $R$)

In this spectrum, a Y value in the XYZ colorimetric system was calculated under conditions of light source: D65 and viewing angle: 2° using a color calculator program (according to JIS Z 8722). This calculated value was set as a luminous absorptance.

A luminous absorptance $A_0$ of the formed Ag alloy film and a luminous absorptance $A_1$ of the Ag alloy film having undergone the Thermo-Hygrostat test were measured as described above. In addition, a change amount $A_1-A_0$ before and after the Thermo-Hygrostat test was calculated. The measurement results are shown in Tables 3 and 4.

(Observation of External Appearance After Thermo-Hygrostat Test)

Figure 2:
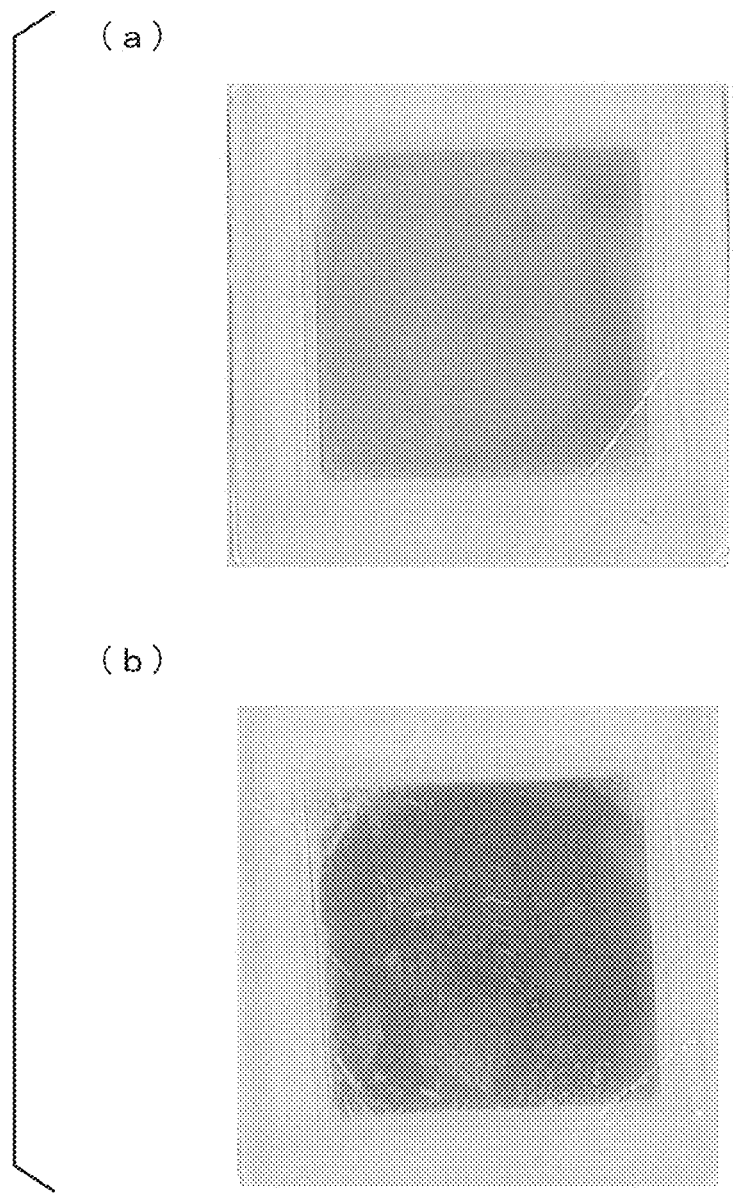
FIG. 2 shows the results of observing the external appearances of Ag alloy films according to Examples after a Thermo-Hygrostat test, in which:
  (a) shows the external appearance of an Ag alloy film evaluated as "A"; and
  (b) shows the external appearance of an Ag alloy film evaluated as "B".

After the Ag alloy film was left to stand in a Thermo-Hygrostat bath at a temperature of 85% and a humidity of 85% for 250 hours, the external appearance thereof was observed by visual inspection. An Ag alloy film in which speckled discoloration was not observed on a film surface as shown in (a) of FIG. 2 was evaluated as "A", and an Ag alloy film in which speckled discoloration was observed on a film surface as shown in (b) of FIG. 2 was evaluated as "B". The evaluation results are shown in Table 4.

(Sulfur Resistance Test)

Each of the film samples was immersed in a 0.01 mass % aqueous sodium sulfide solution at room temperature for 30 minutes, was pulled out from the aqueous solution, and then was sufficiently cleaned with pure water. Next, moisture was removed from the film by blowing dry air to the film. Regarding each of the above samples, sheet resistances and transmittances were measured using the same method as described above, and sulfur resistance was evaluated based on a change amount between the transmittances and a change rate between the sheet resistances. The evaluation results are shown in Table 5.

(Salt-Water Resistance Test)

Each of the film samples was immersed in a 5% aqueous NaCl solution at room temperature for 24 hours, was pulled out from the aqueous solution, and then was sufficiently cleaned with pure water. Next, moisture was removed from the film by blowing dry air to the film. Regarding each of the above samples, sheet resistances and transmittances were measured using the same method as described above, and salt-water resistance was evaluated based on a change amount between the transmittances and a change rate between the sheet resistances. The evaluation results are shown in Table 5. In Table 5, a case where the film disappeared after immersed in the 5% aqueous NaCl solution was represented by "Unmeasurable".

TABLE 1

| | | Ag alloy sputtering target | | | | | | | | | |
|---|---|---|---|---|---|---|---|---|---|---|---|
| | | Composition (at %) | | | | Impurities (mass ppm) | | | | | |
| | | Sn | Cu | Ti | Ag | Na | Si | V | Cr | Fe | Co | Total |
| Examples | 1 | 0.22 | 4.1 | — | Balance | 1 | 7 | 2 | 7 | 3 | 1 | 21 |
| | 2 | 1.53 | 4.0 | — | Balance | 3 | 4 | 1 | 4 | 1 | 1 | 14 |
| | 3 | 2.90 | 4.1 | — | Balance | 4 | 8 | 3 | 4 | 6 | 1 | 26 |
| | 4 | 0.52 | 1.1 | — | Balance | 9 | 4 | 1 | 2 | 3 | 3 | 22 |
| | 5 | 0.54 | 5.3 | — | Balance | 6 | 2 | 3 | 3 | 3 | 1 | 18 |
| | 6 | 0.55 | 7.6 | — | Balance | 8 | 9 | 1 | 2 | 5 | 1 | 26 |
| | 7 | 0.51 | 9.8 | — | Balance | 3 | 5 | 1 | 1 | 2 | 0 | 12 |
| | 8 | 0.43 | 3.2 | — | Balance | 8 | 10 | 9 | 11 | 11 | 13 | 62 |
| | 9 | 0.46 | 3.3 | — | Balance | 19 | 22 | 21 | 9 | 11 | 13 | 95 |
| | 10 | 0.41 | 3.1 | — | Balance | 8 | 16 | 20 | 26 | 13 | 6 | 89 |
| | 11 | 0.54 | 3.3 | — | Balance | 44 | 4 | 1 | 2 | 4 | 3 | 58 |
| | 12 | 0.53 | 3.2 | — | Balance | 6 | 45 | 3 | 2 | 7 | 1 | 64 |
| | 13 | 0.51 | 3.1 | — | Balance | 3 | 1 | 51 | 2 | 4 | 4 | 65 |
| | 14 | 0.49 | 2.9 | — | Balance | 1 | 3 | 1 | 55 | 1 | 3 | 64 |
| | 15 | 0.48 | 2.9 | — | Balance | 5 | 1 | 2 | 2 | 53 | 1 | 64 |
| | 16 | 0.49 | 3.0 | — | Balance | 2 | 1 | 1 | 2 | 3 | 61 | 70 |
| | 17 | 0.51 | 4.1 | 0.1 | Balance | 3 | 2 | 4 | 1 | 1 | 1 | 12 |
| | 18 | 0.44 | 4.1 | 1.0 | Balance | 1 | 2 | 1 | 1 | 5 | 1 | 11 |
| | 19 | 0.51 | 3.5 | 3.0 | Balance | 2 | 2 | 2 | 3 | 3 | 3 | 15 |
| | 20 | 0.44 | 3.4 | — | Balance | 44 | 21 | 24 | 22 | 31 | 13 | 155 |
| | 21 | 0.45 | 3.1 | — | Balance | 23 | 39 | 22 | 18 | 16 | 28 | 146 |
| | 22 | 1.50 | 2.1 | — | Balance | 33 | 18 | 48 | 17 | 22 | 50 | 188 |
| | 23 | 1.60 | 2.2 | — | Balance | 21 | 24 | 21 | 50 | 41 | 22 | 179 |
| | 24 | 0.30 | 3.8 | — | Balance | 3 | 7 | 1 | 6 | 4 | 2 | 23 |
| | 25 | 0.32 | 4.0 | 0.5 | Balance | 1 | 6 | 1 | 5 | 3 | 2 | 18 |
| | 26 | 0.54 | 4.1 | — | Balance | 2 | 5 | 1 | 5 | 1 | 2 | 16 |
| | 27 | 0.55 | 4.1 | 1.0 | Balance | 3 | 1 | 2 | 4 | 8 | 1 | 19 |
| | 28 | 0.44 | 2.0 | — | Balance | 1 | 4 | 0 | 3 | 7 | 2 | 17 |
| | 29 | 0.45 | 2.2 | 1.0 | Balance | 1 | 4 | 1 | 3 | 1 | 2 | 12 |
| | 30 | 0.92 | 2.2 | — | Balance | 23 | 19 | 23 | 19 | 19 | 3 | 106 |
| | 31 | 1.10 | 2.1 | 1.0 | Balance | 21 | 18 | 22 | 14 | 15 | 12 | 102 |
| Comparative Examples | 1 | 0.05 | 3.5 | — | Balance | 1 | 5 | 4 | 7 | 6 | 1 | 24 |
| | 2 | 4.00 | 3.1 | — | Balance | 4 | 2 | 8 | 4 | 2 | 2 | 21 |
| | 3 | 0.51 | 0.3 | — | Balance | 9 | 1 | 4 | 2 | 3 | 4 | 23 |
| | 4 | 0.41 | 11.4 | — | Balance | 7 | 6 | 3 | 3 | 2 | 1 | 22 |
| | 5 | 0.51 | 3.9 | 5.5 | Balance | 1 | 2 | 1 | 2 | 2 | 2 | 10 |

TABLE 2

|  |  | Crystal grain size (μm) | Presence or absence of segregation with grain size of 1 μm or more | Heat treatment temperature after rolling (° C.) | Number of times of abnormal discharge (times/h) Initial period of use | Number of times of abnormal discharge (times/h) After long-term sputtering | Change ratio between sputtering rates | Change rate between film compositions (%) |
|---|---|---|---|---|---|---|---|---|
| Examples | 1 | 60 | Presence | 600 | 0 | 2 | 0.87 | 18 |
|  | 2 | 50 | Presence | 600 | 1 | 3 | 0.88 | 14 |
|  | 3 | 50 | Presence | 600 | 2 | 2 | 0.89 | 15 |
|  | 4 | 100 | Presence | 600 | 0 | 5 | 0.85 | 15 |
|  | 5 | 40 | Presence | 600 | 1 | 1 | 0.82 | 14 |
|  | 6 | 40 | Presence | 600 | 2 | 2 | 0.91 | 17 |
|  | 7 | 30 | Presence | 600 | 1 | 3 | 0.87 | 18 |
|  | 8 | 70 | Presence | 600 | 5 | 4 | 0.87 | 15 |
|  | 9 | 70 | Presence | 600 | 9 | 8 | 0.86 | 16 |
|  | 10 | 80 | Presence | 600 | 11 | 13 | 0.88 | 18 |
|  | 11 | 80 | Presence | 600 | 13 | 15 | 0.87 | 20 |
|  | 12 | 70 | Presence | 600 | 15 | 17 | 0.86 | 21 |
|  | 13 | 80 | Presence | 600 | 13 | 11 | 0.87 | 17 |
|  | 14 | 80 | Presence | 600 | 14 | 13 | 0.88 | 14 |
|  | 15 | 80 | Presence | 600 | 11 | 11 | 0.88 | 15 |
|  | 16 | 16 | Presence | 600 | 12 | 13 | 0.86 | 15 |
|  | 17 | 80 | Presence | 600 | 0 | 0 | 0.85 | 15 |
|  | 18 | 70 | Presence | 600 | 1 | 1 | 0.89 | 14 |
|  | 19 | 80 | Presence | 600 | 1 | 2 | 0.90 | 18 |
|  | 20 | 90 | Presence | 600 | 44 | 56 | 0.88 | 15 |
|  | 21 | 80 | Presence | 600 | 45 | 44 | 0.86 | 14 |
|  | 22 | 70 | Presence | 600 | 41 | 45 | 0.87 | 16 |
|  | 23 | 70 | Presence | 600 | 49 | 47 | 0.86 | 16 |
|  | 24 | 110 | Absence | 650 | 1 | 5 | 0.98 | 5 |
|  | 25 | 120 | Absence | 650 | 0 | 6 | 0.97 | 3 |
|  | 26 | 140 | Absence | 750 | 2 | 4 | 0.98 | 5 |
|  | 27 | 150 | Absence | 750 | 1 | 4 | 0.98 | 3 |
|  | 28 | 220 | Absence | 800 | 0 | 22 | 0.96 | 2 |
|  | 29 | 230 | Absence | 800 | 0 | 25 | 0.96 | 1 |
|  | 30 | 80 | Absence | 650 | 38 | 35 | 0.99 | 2 |
|  | 31 | 70 | Absence | 650 | 39 | 35 | 0.98 | 4 |
| Comparative Examples | 1 | 80 | Presence | 600 | 1 | 1 | 0.88 | 14 |
|  | 2 | 80 | Presence | 600 | 0 | 2 | 0.87 | 18 |
|  | 3 | 70 | Presence | 600 | 2 | 2 | 0.86 | 10 |
|  | 4 | 50 | Presence | 600 | 1 | 1 | 0.87 | 13 |
|  | 5 | 50 | Presence | 600 | 1 | 0 | 0.84 | 15 |

|  |  | Ag alloy film Used target | Ag alloy film Film structure | Evaluation after film formation Sheet resistance (Ω/sq.) | Evaluation after film formation Luminous transmittance | Evaluation after film formation Luminous absorptance |
|---|---|---|---|---|---|---|
| Examples | 101 | Example 1 | Substrate/Ag (6 nm) | 26.5 | 79.7 | 7.6 |
|  | 102 | Example 2 | Substrate/Ag (6 nm) | 31.0 | 78.4 | 8.4 |
|  | 103 | Example 3 | Substrate/Ag (6 um) | 38.9 | 76.8 | 9.0 |
|  | 104 | Example 4 | Substrate/Ag (6 nm) | 16.8 | 81.1 | 7.3 |
|  | 105 | Example 5 | Substrate/Ag (6 nm) | 25.6 | 78.9 | 8.4 |
|  | 106 | Example 6 | Substrate/Ag (6 nm) | 32.8 | 77.9 | 8.6 |
|  | 107 | Example 7 | Substrate/Ag (6 nm) | 37.9 | 77.1 | 9.0 |
|  | 108 | Example 8 | Substrate/Ag (6 nm) | 23.1 | 78.5 | 7.7 |
|  | 109 | Example 9 | Substrate/Ag (6 nm) | 22.8 | 78.1 | 7.5 |
|  | 110 | Example 10 | Substrate/Ag (6 um) | 23.6 | 77.9 | 7.8 |
|  | 111 | Example 11 | Substrate/Ag (6 nm) | 22.9 | 77.7 | 7.7 |
|  | 112 | Example 12 | Substrate/Ag (6 nm) | 23.0 | 78.0 | 7.6 |
|  | 113 | Example 13 | Substrate/Ag (6 nm) | 23.1 | 77.9 | 8.0 |
|  | 114 | Example 14 | Substrate/Ag (6 nm) | 22.7 | 78.1 | 7.9 |
|  | 115 | Example 15 | Substrate/Ag (6 nm) | 22.8 | 77.6 | 8.1 |
|  | 116 | Example 16 | Substrate/Ag (6 nm) | 22.8 | 77.9 | 7.9 |
|  | 117 | Example 17 | Substrate/Ag (6 nm) | 24.4 | 77.1 | 7.8 |
|  | 118 | Example 18 | Substrate/Ag (6 um) | 27.6 | 76.5 | 7.9 |
|  | 119 | Example 19 | Substrate/Ag (6 nm) | 35.6 | 77.1 | 7.9 |
|  | 120 | Example 20 | Substrate/Ag (6 nm) | 23.5 | 78.1 | 8.8 |
|  | 121 | Example 21 | Substrate/Ag (6 nm) | 23.1 | 77.8 | 8.6 |
|  | 122 | Example 22 | Substrate/Ag (6 nm) | 28.7 | 78.6 | 8.3 |
|  | 123 | Example 23 | Substrate/Ag (6 nm) | 28.6 | 78.8 | 8.1 |
|  | 124 | Example 24 | Substrate/Ag (6 nm) | 23.1 | 77.0 | 8.3 |

-continued

|  |  | Ag alloy film | | Evaluation after film formation | | |
|---|---|---|---|---|---|---|
|  |  | Used target | Film structure | Sheet resistance (Ω/sq.) | Luminous transmittance | Luminous absorptance |
|  | 125 | Example 25 | Substrate/Ag (6 nm) | 26.5 | 76.8 | 8.8 |
|  | 126 | Example 26 | Substrate/Ag (6 nm) | 22.8 | 77.2 | 7.6 |
|  | 127 | Example 27 | Substrate/Ag (6 nm) | 26.6 | 75.5 | 8.2 |
|  | 128 | Example 28 | Substrate/Ag (6 nm) | 19.8 | 77.6 | 7.6 |
|  | 129 | Example 29 | Substrate/Ag (6 um) | 22.1 | 78.2 | 8.7 |
|  | 130 | Example 30 | Substrate/Ag (6 nm) | 20.6 | 78.3 | 7.5 |
|  | 131 | Example 31 | Substrate/Ag (6 nm) | 26.6 | 75.8 | 9.0 |
|  | 132 | Example 1 | Substrate/Ag (10 nm) | 12.4 | 70.8 | 9.5 |
|  | 133 | Example 1 | Substrate/Ag (4 nm) | 33.6 | 82.7 | 6.6 |
| Comparative Examples | 101 | Comparative Example 1 | Substrate/Ag (6 nm) | 25.5 | 77.2 | 7.7 |
|  | 102 | Comparative Example 2 | Substrate/Ag (6 nm) | 42.5 | 74.9 | 11.0 |
|  | 103 | Comparative Example 3 | Substrate/Ag (6 um) | 15.1 | 81.4 | 7.6 |
|  | 104 | Comparative Example 4 | Substrate/Ag (6 nm) | 41.8 | 76.3 | 9.7 |
|  | 105 | Comparative Example 5 | Substrate/Ag (6 nm) | 54.9 | 69.8 | 10.8 |

|  |  | After Thermo-Hygrostat test | | | | | |
|---|---|---|---|---|---|---|---|
|  |  | Sheet resistance | | Luminous transmittance | | Luminous absorptance | | Observation of external appearance |
|  |  | (Q/sq.) | Change rate | (%) | Change amount | (%) | Change amount | appearance |
| Examples | 101 | 29.7 | 12% | 78.0 | 1.7 | 9.4 | 1.8 | A |
|  | 102 | 33.1 | 7% | 77.8 | 0.6 | 9.7 | 1.3 | A |
|  | 103 | 40.1 | 3% | 76.5 | 0.3 | 9.5 | 0.5 | A |
|  | 104 | 21.5 | 28% | 78.8 | 2.3 | 9.3 | 2.0 | A |
|  | 105 | 27.1 | 6% | 77.9 | 1.0 | 9.5 | 1.1 | A |
|  | 106 | 33.6 | 2% | 77.3 | 0.6 | 9.4 | 0.8 | A |
|  | 107 | 38.3 | 1% | 76.7 | 0.4 | 9.4 | 0.4 | A |
|  | 108 | 25.8 | 12% | 77.0 | 1.5 | 8.8 | 1.1 | A |
|  | 109 | 28.0 | 23% | 76.3 | 1.8 | 9.4 | 1.9 | A |
|  | 110 | 28.5 | 21% | 75.7 | 2.2 | 9.6 | 1.8 | A |
|  | 111 | 29.4 | 28% | 75.2 | 2.5 | 9.7 | 2.0 | A |
|  | 112 | 29.3 | 27% | 75.4 | 2.6 | 9.7 | 2.1 | A |
|  | 113 | 29.1 | 26% | 75.7 | 2.2 | 9.7 | 1.7 | A |
|  | 114 | 28.8 | 27% | 76.0 | 2.1 | 9.9 | 2.0 | A |
|  | 115 | 28.6 | 25% | 75.2 | 2.4 | 9.9 | 1.8 | A |
|  | 116 | 29.0 | 27% | 75.4 | 2.5 | 9.7 | 1.8 | A |
|  | 117 | 26.0 | 7% | 76.5 | 0.6 | 8.9 | 1.1 | A |
|  | 118 | 28.1 | 2% | 76.1 | 0.4 | 9.1 | 1.2 | A |
|  | 119 | 38.9 | 9% | 76.4 | 0.7 | 9.0 | 1.1 | A |
|  | 120 | 37.8 | 61% | 73.7 | 4.4 | 13.7 | 4.9 | A |
|  | 121 | 36.5 | 58% | 73.7 | 4.1 | 13.0 | 4.4 | A |
|  | 122 | 46.7 | 63% | 75.3 | 3.3 | 12.0 | 3.7 | A |
|  | 123 | 48.9 | 71% | 75.7 | 3.1 | 11.5 | 3.4 | A |
|  | 124 | 25.6 | 11% | 76.3 | 0.7 | 9.3 | 1.0 | A |
|  | 125 | 27.8 | 5% | 76.2 | 0.6 | 9.7 | 0.9 | A |
|  | 126 | 24.7 | 8% | 76.4 | 0.8 | 8.7 | 1.1 | A |
|  | 127 | 27.8 | 5% | 74.8 | 0.7 | 9.3 | 1.1 | A |
|  | 128 | 22.5 | 14% | 77.0 | 0.6 | 8.5 | 0.9 | A |
|  | 129 | 25.6 | 16% | 77.7 | 0.5 | 9.5 | 0.8 | A |
|  | 130 | 34.3 | 67% | 74.9 | 3.4 | 9.7 | 2.2 | A |
|  | 131 | 38.7 | 45% | 72.5 | 3.3 | 11.9 | 2.9 | A |
|  | 132 | 13.1 | 6% | 69.7 | 1.1 | 9.9 | 0.4 | A |
|  | 133 | 41.1 | 22% | 80.2 | 2.5 | 9.1 | 2.5 | A |
| Comparative Examples | 101 | 44.1 | 73% | 67.1 | 10.1 | 16.4 | 8.7 | A |
|  | 102 | 43.0 | 1% | 74.6 | 0.3 | 11.5 | 0.5 | A |
|  | 103 | 370.9 | 2356% | 76.8 | 4.6 | 13.1 | 5.5 | B |
|  | 104 | 41.7 | 0% | 75.9 | 0.4 | 10.1 | 0.4 | A |
|  | 105 | 56.9 | 4% | 71.8 | 0.3 | 11.1 | 0.3 | A |

TABLE 5

| | | After sulfur resistance test | | | | After salt-water resistance test | | | |
|---|---|---|---|---|---|---|---|---|---|
| | | Sheet resistance | | Luminous transmittance | | Sheet resistance | | Luminous transmittance | |
| | | (Ω/sq.) | Change rate | (%) | Change amount | (Ω/sq.) | Change rate | (%) | Change amount |
| Examples | 101 | 206.3 | 678.5% | 65.4 | 14.3 | Unmeasurable | — | Unmeasurable | — |
| | 102 | 207.0 | 567.6% | 65.2 | 13.2 | Unmeasurable | — | Unmeasurable | — |
| | 103 | 229.4 | 489.7% | 64.5 | 12.3 | Unmeasurable | — | Unmeasurable | — |
| | 104 | 130.8 | 678.4% | 70.2 | 10.9 | Unmeasurable | — | Unmeasurable | — |
| | 105 | 207.1 | 708.9% | 67.7 | 11.2 | Unmeasurable | — | Unmeasurable | — |
| | 106 | 267.8 | 716.5% | 65.9 | 12.0 | Unmeasurable | — | Unmeasurable | — |
| | 107 | 302.8 | 699.0% | 65.3 | 11.8 | Unmeasurable | — | Unmeasurable | — |
| | 108 | 151.4 | 555.3% | 65.1 | 13.4 | Unmeasurable | — | Unmeasurable | — |
| | 109 | 140.1 | 514.3% | 62.6 | 15.5 | Unmeasurable | — | Unmeasurable | — |
| | 110 | 162.3 | 587.6% | 64.2 | 13.7 | Unmeasurable | — | Unmeasurable | — |
| | 111 | 162.0 | 607.4% | 62.9 | 14.8 | Unmeasurable | — | Unmeasurable | — |
| | 112 | 164.5 | 615.3% | 65.5 | 12.5 | Unmeasurable | — | Unmeasurable | — |
| | 113 | 174.9 | 657.1% | 60.5 | 17.4 | Unmeasurable | — | Unmeasurable | — |
| | 114 | 182.0 | 701.8% | 65.0 | 13.1 | Unmeasurable | — | Unmeasurable | — |
| | 115 | 182.0 | 698.1% | 64.4 | 13.2 | Unmeasurable | — | Unmeasurable | — |
| | 116 | 169.7 | 644.3% | 63.8 | 14.1 | Unmeasurable | — | Unmeasurable | — |
| | 117 | 32.6 | 33.5% | 74.8 | 2.3 | 33.6 | 37.6 | 74.3 | 2.8 |
| | 118 | 34.6 | 25.4% | 74.7 | 1.8 | 36.1 | 30.9 | 74.0 | 2.5 |
| | 119 | 42.6 | 19.8% | 76.2 | 0.9 | 43.5 | 22.1 | 75.1 | 2.0 |
| | 120 | 156.9 | 567.7% | 66.8 | 11.3 | Unmeasurable | — | Unmeasurable | — |
| | 121 | 180.7 | 682.1% | 63.6 | 14.2 | Unmeasurable | — | Unmeasurable | — |
| | 122 | 155.4 | 441.3% | 66.3 | 12.3 | Unmeasurable | — | Unmeasurable | — |
| | 123 | 228.4 | 698.7% | 64.5 | 14.3 | Unmeasurable | — | Unmeasurable | — |
| | 124 | 197.8 | 756.4% | 63.1 | 13.9 | Unmeasurable | — | Unmeasurable | — |
| | 125 | 35.7 | 34.6% | 74.4 | 2.4 | 35.6 | 34.5 | 74.6 | 2.4 |
| | 126 | 125.7 | 451.3% | 64.4 | 12.8 | Unmeasurable | — | Unmeasurable | — |
| | 127 | 34.5 | 29.8% | 73.3 | 2.2 | 34.5 | 29.8 | 73.6 | 1.9 |
| | 128 | 119.2 | 501.8% | 65.3 | 12.3 | Unmeasurable | — | Unmeasurable | — |
| | 129 | 27.8 | 25.6% | 76.3 | 1.9 | 28.4 | 28.6 | 76.4 | 1.8 |
| | 130 | 123.6 | 499.9% | 65.7 | 12.6 | Unmeasurable | — | Unmeasurable | — |
| | 131 | 32.8 | 23.4% | 74.1 | 1.7 | 33.9 | 27.4 | 73.8 | 2.0 |
| | 132 | 78.6 | 534.1% | 57.8 | 13.0 | Unmeasurable | — | Unmeasurable | — |
| | 133 | 374.1 | 1013.4% | 69.6 | 13.1 | Unmeasurable | — | Unmeasurable | — |
| Comparative Examples | 101 | 153.4 | 501.4% | 63.2 | 14.0 | Unmeasurable | — | Unmeasurable | — |
| | 102 | 216.7 | 409.8% | 61.2 | 13.7 | Unmeasurable | — | Unmeasurable | — |
| | 103 | 120.8 | 699.9% | 67.9 | 13.5 | Unmeasurable | — | Unmeasurable | — |
| | 104 | 279.0 | 567.5% | 63.2 | 13.1 | Unmeasurable | — | Unmeasurable | — |
| | 105 | 61.0 | 11.1% | 69.2 | 0.6 | 65.3 | 18.9 | 68.2 | 1.6 |

In the Ag alloy film according to Comparative Example 101 which was formed using the Ag alloy sputtering target according to Comparative Example 1 in which the Sn content was lower than the range of the present invention, the luminous transmittance and the luminous absorptance deteriorated significantly after the Thermo-Hygrostat test, and environment resistance was not sufficient.

In the Ag alloy film according to Comparative Example 102 which was formed using the Ag alloy sputtering target according to Comparative Example 2 in which the Sn content was higher than the range of the present invention, the sheet resistance and the luminous absorptance after the film formation were high, and electrical properties and optical properties were not sufficient.

In the Ag alloy film according to Comparative Example 103 which was formed using the Ag alloy sputtering target according to Comparative Example 3 in which the Cu content was lower than the range of the present invention, the sheet resistance after the Thermo-Hygrostat test increased significantly, speckles were formed on the film surface, and environment resistance was not sufficient.

In the Ag alloy film according to Comparative Example 104 which was formed using the Ag alloy sputtering target according to Comparative Example 4 in which the Cu content was higher than the range of the present invention, the sheet resistance after film formation was high, and electrical properties were not sufficient.

In the Ag alloy film according to Comparative Example 105 which was formed using the Ag alloy sputtering target according to Comparative Example 5 in which the Ti content was higher than the range of the present invention, the sheet resistance after film formation was high, the luminous transmittance was low, and electrical properties and optical properties were not sufficient.

On the other hand, in the Ag alloy films which were formed using the Ag alloy sputtering targets according to Examples, electrical properties, optical properties, and environment resistance were excellent.

Next, in the Ag alloy sputtering targets according to Examples 20 to 23, 30, and 31, the total amount of Na, Si, V, Cr, Fe, and Co among the impurity elements was higher than 100 mass ppm, and the number of times of abnormal discharge was large.

In addition, in the Ag alloy sputtering targets according to Examples 11 to 16, the amount of one or more of Na, Si, V, Cr, Fe, and Co among the impurity elements was higher than 30 mass ppm, and the number of times of abnormal discharge was slightly larger.

On the other hand, in the Ag alloy sputtering targets according to the other Examples in which the total amount of Na, Si, V, Cr, Fe, and Co among the impurity elements was 100 mass ppm or lower and in which the amount of each of Na, Si, V, Cr, Fe, and Co among the impurity elements was 30 mass ppm or lower, the number of times of abnormal discharge was small.

In addition, in the Ag alloy sputtering targets according to Examples 28 and 29 in which the average crystal grain size on the sputtering surface was more than 200 µm, the number of times of abnormal discharge after long-term sputtering was large.

On the other hand, in the Ag alloy sputtering targets according to the other Examples in which the average crystal grain size on the sputtering surface was 200 µm or less, the number of times of abnormal discharge after long-term sputtering was small.

Further, in the Ag alloy sputtering targets according to Examples 1 to 23 in which segregations having a grain size of 1 µm or more were observed, the change ratio between the sputtering rates and the change rate between the film compositions before and after long-term sputtering were relatively large.

On the other hand, in the Ag alloy sputtering targets according to the other Examples in which no segregations having a grain size of 1 µm or more were observed, the change ratio between the sputtering rates and the change rate between the film compositions before and after long-term sputtering were suppressed.

In addition, in the Ag alloy sputtering targets according to Examples 17 to 19, 25, 27, 29, and 31 including Ti, it was verified that sulfur resistance and salt-water resistance were excellent.

It was verified from the above results of the verification experiment that, according to Examples, an Ag alloy sputtering target with which an Ag alloy film having excellent electrical properties, optical properties, and environment resistance can be formed, and an Ag alloy film can be provided.

INDUSTRIAL APPLICABILITY

Using the Ag alloy sputtering target according to the present invention, an Ag alloy film having excellent electrical properties, optical properties, and environment resistance can be formed, and the occurrence of abnormal discharge during film formation can be reduced. In addition, the Ag alloy film which is formed using the Ag alloy sputtering target according to the present invention has excellent electrical conductivity (electrical properties) and thus is suitable for an electronic device such as an organic light-emitting diode device.

The invention claimed is:

1. An Ag alloy sputtering target comprising, as a composition, 0.1 at % to 2.0 at % of Sn, 2.0 at % to 10.0 at % of Cu, and a balance of Ag and inevitable impurities, wherein
    a total amount of Na, Si, V, Cr, Fe, and Co among the inevitable impurities is 100 mass ppm or lower,
    an average crystal grain size on a sputtering surface is 200 µm or less, and
    a grain size of a segregation formed of Cu, Sn, or an intermetallic compound of Cu and Sn is less than 1 µm.

2. The Ag alloy sputtering target according to claim 1, wherein an amount of each of Na, Si, V, Cr, Fe, and Co among the inevitable impurities is 30 mass ppm or lower.

3. The Ag alloy sputtering target according to claim 1, further comprising 0.1 at % to 3.0 at % of Ti.

4. A method of forming an Ag alloy film,
    wherein the Ag alloy film is formed using an Ag alloy sputtering target,
    wherein the Ag alloy sputtering target comprises, as a composition, 0.1 at % to 2.0 at % of Sn, 2.0 at % to 10.0 at % of Cu, and a balance of Ag and inevitable impurities, wherein
    a total amount of Na, Si, V, Cr, Fe, and Co among the inevitable impurities is 100 mass ppm or lower,
    an average crystal grain size on a sputtering surface is 200 µm or less, and
    a grain size of a segregation formed of Cu, Sn, or an intermetallic compound of Cu and Sn is less than 1 µm.

5. The Ag alloy sputtering target according to claim 2, further comprising 0.1 at % to 3.0 at % of Ti.

* * * * *